(12) United States Patent
Maejima et al.

(10) Patent No.: US 7,482,870 B2
(45) Date of Patent: Jan. 27, 2009

(54) CLASS D AMPLIFIER

(75) Inventors: Toshio Maejima, Shizuoka-ken (JP);
Masayuki Iwamatsu, Shizuoka-ken (JP)

(73) Assignee: Yamaha Corporation, Hamamatsu-shi (JP)

( * ) Notice: Subject to any disclaimer, the term of this patent is extended or adjusted under 35 U.S.C. 154(b) by 28 days.

(21) Appl. No.: 11/541,999

(22) Filed: Sep. 28, 2006

(65) Prior Publication Data
US 2007/0103234 A1 May 10, 2007

(30) Foreign Application Priority Data

| | | |
|---|---|---|
| Sep. 28, 2005 | (JP) | 2005-282128 |
| Aug. 23, 2006 | (JP) | 2006-226269 |
| Aug. 23, 2006 | (JP) | 2006-226272 |

(51) Int. Cl.
*H03F 21/00* (2006.01)

(52) U.S. Cl. .................. 330/207 P; 330/298

(58) Field of Classification Search ............ 330/207, 330/278, 279, 298
See application file for complete search history.

(56) References Cited

U.S. PATENT DOCUMENTS

| | | | |
|---|---|---|---|
| 3,620,631 A | * | 11/1971 | Stopka et al. ............ 455/244.1 |
| 4,173,739 A | | 11/1979 | Yoshida |
| 4,376,267 A | * | 3/1983 | Chu et al. .................. 330/284 |
| 4,600,891 A | | 7/1986 | Taylor, Jr. et al. |
| 4,724,396 A | | 2/1988 | Taylor, Jr. et al. |
| 6,122,331 A | * | 9/2000 | Dumas ....................... 375/345 |
| 2004/0184621 A1 | | 9/2004 | Andersen et al. |

FOREIGN PATENT DOCUMENTS

| | | |
|---|---|---|
| EP | 1003280 A2 | 5/2000 |
| JP | 4-172705 | 6/1992 |
| JP | 2003-332867 | 11/2003 |

OTHER PUBLICATIONS

European Patent Office, "European Search Report," (Dec. 6, 2006).

* cited by examiner

*Primary Examiner*—Henry K Choe
(74) *Attorney, Agent, or Firm*—Pillsbury Winthrop Shaw Pittman LLP

(57) ABSTRACT

A class D amplifier includes: an amplifier that generates a digital signal for driving a load based on an input signal; an attenuator that attenuates the input signal according to an attenuation command signal; and a clip prevention controller that outputs the attenuation command signal to intermittently attenuate the input signal when the digital signal is brought into a clip state or a near-clip state.

17 Claims, 9 Drawing Sheets

CLASS D AMPLIFIER

BACKGROUND OF THE INVENTION

The present invention relates to a class D amplifier suitable as a power amplifier for an audio system.

The class D amplifier is an amplifier that generates a pulse train with its pulse width or time density modulated according to an input signal and drives a load by way of the pulse train. The class D amplifier is often used as a power amplifier for driving a speaker in an audio system. In this type of power amplifier, clip occurs in an output signal waveform in case the level of an input signal exceeds a proper range. Such clip must be prevented because, once given to speakers as a load, it is output from the speakers as an unpleasant sound. In the related art technology, a level adjuster has been arranged before a power amplifier in order to optimize the amplitude of an input signal to the power amplifier thus preventing occurrence of clip. This technology is disclosed as "related art technology" for example in JP-A-2003-332867.

In the related art technology, the amplitude of the input signal to the power amplifier is compressed according to its level thus preventing clip. The problem is that the signal input to the power amplifier is accompanied by nonlinear distortion caused by the nonlinear characteristic of the level adjuster and the nonlinear distortion appearing on the output signal waveform degrades the quality of the sound regenerated from the speakers.

According to the technology disclosed in JP-B-3,130,919, variable gain amplification means is provided in the preceding stage of the PWM (Pulse Width Modulation) modulator of a class D amplifier. In case an input signal that is likely to generate clip is given to a PWM modulator, the source voltage of a switching amplification stage arranged after the PWM modulator is switched to a high voltage and the gain of the variable gain amplification means before the PWM modulator is decreased to prevent clip. The problem with the technology disclosed in Patent Reference 1 is that means for controlling the switching amplification stage is required to prevent clip thus resulting in a larger circuit. The technology disclosed in Patent Reference 1 switches the source voltage of the switching amplification stage to a high voltage when clip is likely to occur. Thus, the peak level of the output signal of a class D amplifier may become unnecessarily high. This does not fully satisfy the needs for audio reproduction at an appropriate sound volume and with reduced distortion.

SUMMARY OF THE INVENTION

The invention has been accomplished in view of the aforementioned circumstances. An object of the invention is to provide a class D amplifier capable of preventing occurrence of clip without generating such nonlinear distortion.

Another object of the invention is to provide a class D amplifier capable of amplifying an input signal with reduced distortion across the entire region of the dynamic range of the input signal and obtaining an output signal at an appropriate level.

In order to solve the above objects, the present invention is characterized by having the following arrangements.

(1) A class D amplifier comprising:
an amplifier that generates a digital signal for driving a load based on an input signal;
an attenuator that attenuates the input signal according to an attenuation command signal; and
a clip prevention controller that outputs the attenuation command signal to intermittently attenuate the input signal when the digital signal is brought into a clip state or a near-clip state.

(2) The class D amplifier according to (1), wherein
the amplifier outputs the digital signal having a pulse width corresponding to the input signal according to a periodic synchronization signal, and
the clip prevention controller outputs the attenuation command signal according to the synchronization signal.

(3) The class D amplifier according to (2), further comprising a triangular wave generator for outputting a periodic triangular wave signal as the synchronization signal,
wherein the amplifier includes an error integrator for integrating and outputting errors between the input signal and the digital signal, and a pulse-width modulator for outputting a digital signal pulse-width-modulated according to a level of the output signal from the error integrator based on a comparison between the output signal from the error integrator and the triangular wave signal, and
wherein the clip prevention controller assumes that the digital signal is in the clip state or near-clip state when the output signal from the error integrator exceeds a reference level and outputs the attenuation command signal.

(4) The class D amplifier according to (3), wherein the clip prevention controller includes a comparison voltage generator for generating a comparison voltage at a level where the comparison voltage crosses the triangular wave signal when the output signal from the error integrator exceeds the reference level, and a comparator for comparing the comparison voltage with the triangular wave signal to output the attenuation command signal.

(5) The class D amplifier according to (3), wherein the clip prevention controller detects that the digital signal is in the clip state or near-clip state based on the level of the digital signal at a timing of a peak of the triangular wave signal or at an immediately previous timing of the peak.

(6) The class D amplifier according to (3), wherein the clip prevention controller holds a signal showing the result of comparison between the output signal from the error integrator in the pulse-width modulator and the triangular wave signal at a timing of a peak of the triangular wave signal or at an immediately after timing of the peak and detects that the digital signal is in the clip state or near-clip state based on the held signal.

(7) The class D amplifier according to any one of (1) through (6), wherein the input signal is an analog signal.

(8) The class D amplifier according to any one of (1) through (6), wherein the input signal is a digital signal.

(9) A class D amplifier comprising:
an amplifier that generates a digital signal for driving a load based on an input signal; and
a gain controller that decreases a gain of the amplifier according to an increase in a level of the input signal so that a peak level of a waveform of the digital signal maintains a predetermined level when the digital signal is brought into a clip state or a near-clip state.

(10) The class D amplifier according to (9), wherein the gain controller includes:
an attenuator that attenuates the input signal according to an attenuation command signal, the attenuator being provided at an input part of the amplifier; and a clip prevention controller that detects that the digital signal is brought into the clip state or near-clip state by monitoring a signal of a predetermined node in the amplifier and outputs the attenuation command signal.

(11) The class D amplifier according to (10), wherein the amplifier outputs a digital signal having a pulse width corresponding to the input signal according to a periodic synchronization signal, and the clip prevention controller outputs the attenuation command signal according to the synchronization signal.

(12) The class D amplifier according to (11), further comprising a triangular wave generator that outputs a periodic triangular wave signal as the synchronization signal, wherein the amplifier includes an error integrator for integrating and outputting errors between the input analog signal and the digital signal and a pulse-width modulator for outputting a digital signal pulse-width-modulated according to a level of an output signal from the error integrator based on a comparison between the output signal from the error integrator and the triangular wave signal, and wherein clip prevention controller assumes that the digital signal is in the clip state or near-clip state when the output signal from the error integrator exceeds a reference level and outputs the attenuation command signal.

(13) The class D amplifier according to (12), wherein the clip prevention controller includes a comparison voltage generator for generating a comparison voltage at a level where the comparison voltage crosses said triangular wave signal when the output signal from the error integrator exceeds a reference level, and a comparator for comparing the comparison voltage with the triangular wave signal to output the attenuation command signal.

(14) The class D amplifier according to (12), wherein the clip prevention controller detects that the digital signal is in the clip state or near-clip state based on the level of the digital signal at a timing of a peak of the triangular wave signal or at an immediately previous timing of the peak.

(15) The class D amplifier according to (12), wherein the clip prevention controller holds a signal showing the result of comparison between the output signal from the error integrator in the pulse-width modulator and the triangular wave signal at a timing of a peak of the triangular wave signal or at an immediately after timing of the peak and detects that the digital signal is in the clip state or near-clip state based on the held signal.

(16) The class D amplifier according to (9), wherein the amplifier includes a pulse generator for outputting as the digital signal a pulse having a pulse width or pulse density modulated by a modulating signal, the gain controller forms a part of the amplifier and includes a dynamic range compressor for performing dynamic range compression on a compression target signal given from a preceding stage to output as the modulating signal the resulting signal to the pulse generator, the dynamic range compressor amplifies the compression target signal with a predetermined gain in a linear region where the peak level of the compression target signal is lower than a predetermined threshold, and decreases the gain according to an increase in the peak level of the compression target signal so that the peak level of the modulating signal output to the pulse generator maintains the predetermined level in a saturation region where the peak level of the compression target signal exceeds the predetermined threshold.

(17) The class D amplifier according to (16), wherein the gain controller includes variable gain amplifier arranged in a preceding stage of the dynamic range compressor, and the variable gain amplifier amplifies the input signal with a gain corresponding to a sound volume adjustment signal provided from outside and outputs the resulting signal as the compression target signal to the dynamic range compressor.

(18) The class D amplifier according to any one of (9) through (17), wherein the input signal is an analog signal.

(19) The class D amplifier according to any one of (9) through (17), wherein the input signal is a digital signal.

According to this invention, an attenuation command signal is generated to intermittently attenuate the input analog signal when the digital signal is brought into the clip or near-clip state. As a result, the input analog signal to the amplifier part is intermittently thinned on a time axis thus preventing clip on the digital signal. In this case, the input analog signal is intermittently thinned although its waveform is substantially unchanged. This prevents clip without generating waveform distortion.

Further, according to the invention, when the digital signal is brought into a clip or a near-clip state, the gain control means decreases the gain of the amplifier according to an increase in the level of the input signal so that the peak level of a waveform shown by the digital signal will maintain a certain level. It is thus possible to amplify an input signal with reduced distortion across the entire region of the dynamic range of the input signal and obtain an output signal at an appropriate level.

DETAILED DESCRIPTION OF PREFERRED EMBODIMENTS

Embodiments of the invention will be described referring to drawings.

First Embodiment

Figure 1:
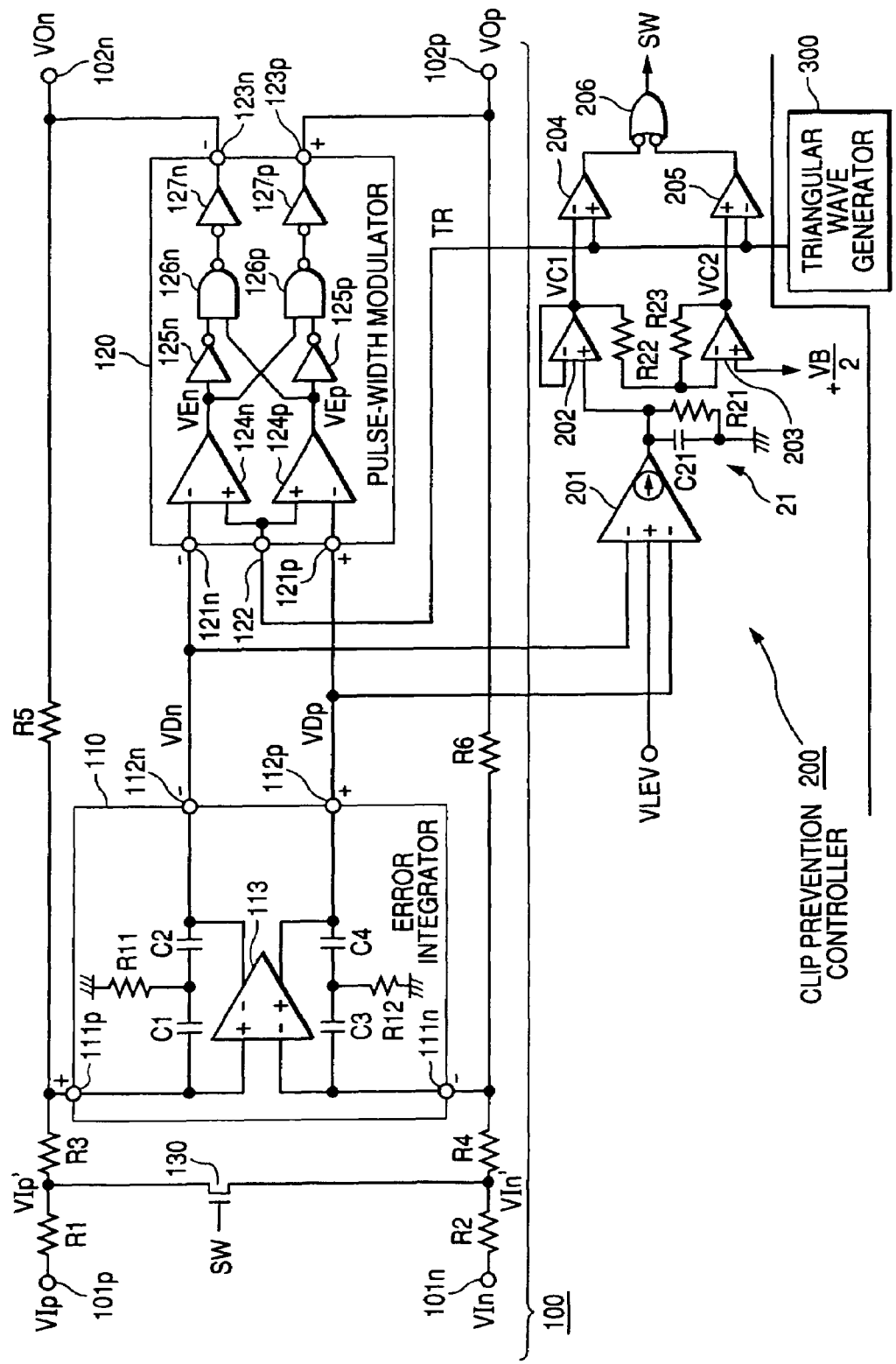
FIG. 1 is a circuit diagram showing the configuration of a class D amplifier according to the first embodiment of the invention.

FIG. 1 is a circuit diagram showing the configuration of a class D amplifier according to the first embodiment of the invention. The class D amplifier roughly includes an amplifier part 100, a clip prevention controller 200, and a triangular wave generator 300. The triangular wave generator 300 is a circuit that generates a triangular wave signal TR of a constant cycle changing in the shape formed by a linear slope within the voltage range of 0V to +VB and supplies the triangular wave signal TR to the amplifier part 100 and the clip prevention controller 200. The amplifier part 100 is a device for generating a digital signal to drive a load based on an input analog signal. Specifically, the amplifier part 100 is a circuit for generating a positive phase digital signal VOp and a negative phase digital signal VOn which are pulse-width-modulated according to the levels of the positive phase analog input signal VIp and the negative phase analog input signal VIn supplied to input terminals 101p and 101n and outputting the digital signals from output terminals 102p and 102n. The clip prevention controller 200 is a circuit for monitoring a signal to be fetched from a predetermined node in the amplifier part 100. When the level of the signal has deviated from a predetermined range, the clip prevention controller 200 assumes that the output signal VOp or VOn is in the clip or near-clip state, and generates an attenuation command signal SW to command intermittent attenuation of an input analog signal and supplies the attenuation command signal SW to amplifier part 100. The triangular wave signal TR is used as a synchronization signal to determine the generation timing of the digitals signals VOp and VOn and the generation timing of the attenuation command signal SW in the amplifier part 100 and the clip prevention controller 200. The configuration of the amplifier part 100 and the clip prevention controller 200 will be described in this order.

In the amplifier part 100, resistors R1, R3, R5 are serially inserted between the input terminal 101p and the output terminal 102n. Resistors R2, R4, R6 are serially inserted between the input terminal 101n and the output terminal 102p. The common connection point of the resistors R3 and R5 is connected to the positive phase input terminal 111p of an error integrator 110. The common connection point of the resistors R4 and R6 is connected to the negative phase input terminal 111n of the error integrator 110. A switch 130 using a MOSFET (field effect transistor composed of a Metal-Oxide Semiconductor) is inserted between the common connection point of the resistors R1 and R3 and the common connection point of the resistors R2 and R4. The switch 130 functions as an attenuator for intermittently attenuating an input analog signal according to the attenuation command signal SW supplied from the clip prevention controller 200. The switch 130 and the clip prevention controller 200 serve as a gain controller for decreasing the entire gain of the amplifier part 100 according to an increase in the level of each of the input signal VIp and VIn so that the peak level of the waveform shown by the digital signal VOp or VOn will maintain a certain level when the digital signal VOp or VOn is brought into a clip or a near-clip state.

In the error integrator 110, the positive phase input analog signal VIp is supplied to the positive phase input terminal 111p via the resistors R1 and R3, and the negative phase input analog signal VIn is supplied to the negative phase input terminal 111n via the resistors R2 and R4. A negative phase digital signal VOn is fed back to the positive phase input terminal 111p of the error integrator 110. A positive phase digital signal VOp is fed back to the negative phase input terminal 111n of the error integrator 110. The error integrator 110 is a circuit for integrating the errors between thus supplied input analog signals VIp and VIn and the digital signals VOp and VOn and outputting a positive phase signal VDp and a negative phase signal VDn respectively from the positive phase output terminal 112p and the negative output terminal 112n. Various types of error integrator 110 are available. The illustrated example uses a second-order error integrator 110 including a differential amplifier 113, four capacitors C1 to C4 and two resistors R11 and R12. The positive phase input terminal (plus input terminal) and the negative phase input terminal (minus input terminal) of the differential amplifier 113 serve as the positive phase input terminal 111p and the negative phase input terminal 111n of the error integrator 110, respectively. The positive phase output terminal (plus output terminal) and the negative phase output terminal (minus output terminal) of the differential amplifier 113 serve as the positive phase output terminal 112p and the negative phase output terminal 112n of the error integrator 110, respectively. Capacitors C1 and C2 for integrating errors are serially inserted between the positive phase input terminal and the negative phase output terminal of the differential amplifier 113. The common connection point of these capacitors is grounded via a resistor R11. Capacitors C3 and C3 for integrating errors are serially inserted between the negative phase input terminal and the positive phase output terminal of the differential amplifier 113. The common connection point of these capacitors is grounded via a resistor R12.

The positive phase input terminal 121p and the negative phase input terminal 121n of a pulse-width modulator 120 are connected to the positive phase output terminal 112p and the negative phase output terminal 112n of the error integrator 110, respectively. A triangular wave signal TR output from the triangular wave generator 300 is supplied to the triangular wave input terminal of the pulse-width modulator 120. The positive phase output terminal 123p and the negative phase output terminal 123n of the pulse-width modulator 120 serve as the output terminals 102p and 102n of the amplifier part 100, respectively. The pulse-width modulator 120 is a circuit for generating a positive phase digital signal VOp and a negative phase digital signal VOn having pulse widths corresponding to the levels of the output signals VDp and VDn of the error integrator 110 by using the triangular wave signal TR supplied to the triangular wave input terminal 122 and outputting the digital signals from the positive output terminal 123p and the negative output terminal 123n. Various types of pulse-width modulator 120 are available. The illustrated example uses a pulse-width modulator including: comparators 124p and 124n whose positive phase input terminals receive the triangular wave signal TR and whose negative phase input terminals receive a positive output signal VDp and negative output signal VDn from the error integrator 110, respectively; inverters 125p and 125n for inverting the level of each of output signals VEp and VEn from the comparators 124p and 124n and outputting the resulting signals; a NAND gate 126p to which the output signal VEn from the comparator 124n and the output signal from the inverter 125p are input; a NAND gate 126n to which the output signal VEp from the comparator 124p and the output signal from the inverter 125n are input; and inverters 127p and 127n for inverting the level of each of the output signals from the NAND dates 126p and 126n and outputting the resulting signals as signals VOp and VOn from the positive phase output terminal 123p and the negative phase output terminal 123n.

This is the end of the description of the configuration of the amplifier part 100.

Next, the configuration of the clip prevention controller 200 will be described. A current output comparator 201 is a circuit for comparing the level of each of the output signals VDp and VDn from the error integrator 110 with a reference level VLEV and outputting a constant current to a parallel circuit of a capacitor C21 and a resistor R21 in the case that at least one of the output signals VDp and VDn exceeds the reference level VLEV. The reference level VLEV is set to the peak voltage VB of the triangular wave signal TR or a voltage slightly lower than VB. In this example, typically in order not to cause digital output signals VOp and VOn to generate clip, the reference level VLEV is set to the upper peak voltage of the triangular wave signal TR or a voltage slightly lower than the upper peak voltage. The clip prevention controller 200 according to the embodiment compares the upper peak voltage of the output signal VDp (or VDn) with the reference level VLEV and generates an attenuation command signal SW for clip prevention based on the comparison results, so that the reference level VLEV is set as described above. The clip prevention controller 200 may compare the lower peak voltage of the output signal VDp (or VDn) with the reference level VLEV and generate an attenuation command signal SW for clip prevention based on the comparison results. In this case, the reference level VLEV is set to the lower peak voltage of the triangular wave signal TR or a voltage slightly higher than the lower peak voltage. The reference level VLEV may be set according to the variation range of the pulse width modulation factor of the output digital signals VOp and VOn. In case it is necessary to maximize the variation range of the pulse width modulation factor of the output digital signals VOp and VOn, the reference level VLEV must be set as close as possible to VB or 0V. Otherwise, the reference level VLEV may be set apart from VB or 0V. In order to effect the clip prevention feature, the reference level VLEV may be arbitrarily set within the range of VB/2<VLEV<VB or 0V<VLEV<VB.

Figure 2:
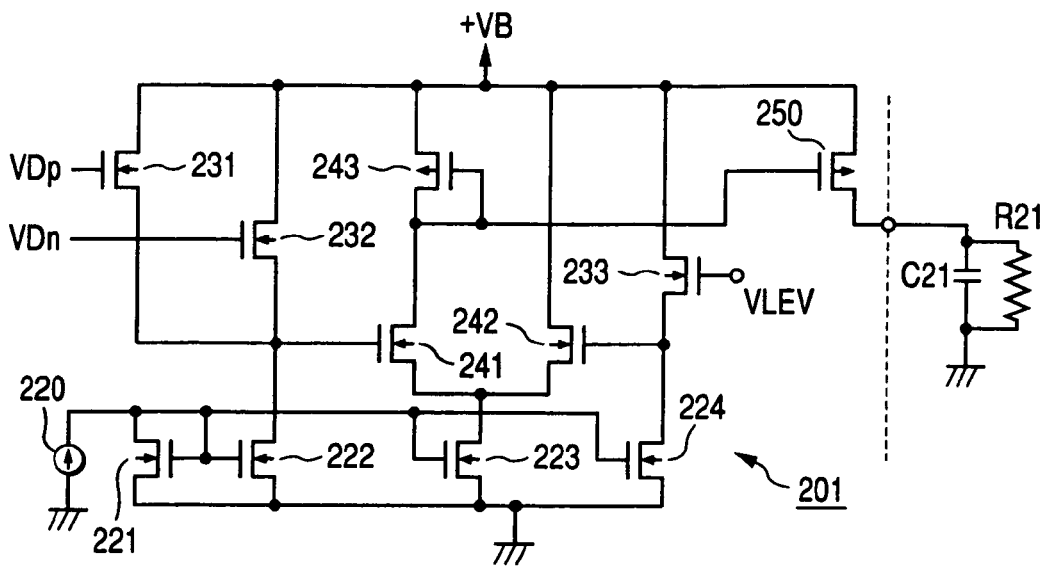
FIG. 2 is a circuit diagram showing an exemplary configuration of a current output comparator according to the first embodiment.

FIG. 2 is a circuit diagram showing an exemplary configuration of the current output comparator 201. In FIG. 2, an N-channel FET 221 has its source grounded and its drain and gate connected to a constant current source 220. N-channel FETs 222 to 224 have their sources grounded and their gates given the same gate voltage as the N-channel FET 221. That is, the N-channel FETs 221 to 224 constitute a current mirror. Drain currents proportional to the drain current flowing through the N-channel FET 221 flow through the N-channel FETs 222 to 224.

The N-channel FET 231 and 232 has their drains connected to a power source with a voltage +VB. Each gate is given the output signals VDp and VDn from the error integrator 110. The sources are commonly connected to the drain of the N-channel FET 222. That is, the N-channel FETs 231 and 232 constitutes source followers whose common load is the N-channel FET 222. A voltage lower by a predetermined amount (voltage corresponding to the threshold of the N-channel FET) than the greater one of the gate voltages VDp and VDn from the N-channel FETs 231 and 232 is generated at the drain of the N-channel FET 222. The N-channel FET 233 has its drain connected to the power source with a voltage +VB, its gate given the reference level VLEV, and has its source connected to the drain of the N-channel FET 224. The N-channel FET 233 constitutes a source follower whose load is the N-channel FET 224. A voltage lower by a predetermined amount than the gate voltage VLEV is generated at the drain of the N-channel FET 224.

The N-channel FETs 241 and 242 form an FET pair constituting a differential amplifier together with the N-channel FET 223. The N-channel FET 241 has its drain connected to the power source with a voltage +VB via a P-channel FET 243 and has its gate given the drain voltage of the N-channel FET 222. The N-channel FET 242 has its drain directly connected to the power source with a voltage +VB and has its gate given the drain voltage of the N-channel FET 224. The sources of the N-channel FETs 241 and 242 are commonly connected to the drain of the N-channel FET 223.

The P-channel FET 243 has its source directly connected to the power source with a voltage +VB and its drain and gate connected to the drain of the N-channel FET 241. A P-channel FET 250 has its gate given the same gate voltage as the P-channel FET 243 and has its source directly connected to the power source with a voltage +VB. A parallel circuit of a capacitor C21 and a resistor R21 is inserted between its drain and ground lead. That is, the P-channel FETs 243 and 250 constitutes a current mirror and a drain current proportional to the drain current of the P-channel FET 243 flows through the P-channel FET 250.

In this configuration, in case each of the output signals VDp and VDn from the error integrator 110 is below the reference level VLEV, the gate bias for the N-channel FET 242 is greater than the gate bias for the N-channel FET 241, and the N-channel FET 242 is ON while the N-channel FET 241 is OFF. Thus, the P-channel FET 243 is OFF while the P-channel FET 250 is OFF. In case at least one of the output signals VDp and VDn from the error integrator 110 exceeds the reference level VLEV, the gate bias for the N-channel FET 241 is greater than the gate bias for the N-channel FET 242, and the N-channel FETs 241 is ON while the N-channel FET 242 is OFF. Thus, the P-channel FET 243 is ON while the P-channel FET 250 is also ON. The drain current flowing through the P-channel FET 250 is proportional to the drain current flowing through the P-channel FET 243 and the P-channel FET 223, that is, proportional to the output current from the constant current source 220.

Referring to FIG. 1, a portion from the current output comparator 201 to the preceding stage of the comparators 204 and 205 constitutes a comparison voltage generator for generating a comparison voltage having a level at which the output signal of the error integrator 110 crosses the triangular wave signal TR when the output signal has exceeded the reference level LEV. To be more precise, the parallel circuit comprising the capacitor C21 and the resistor R21 constitutes an integrator 21 for integrating the currents output from the current output comparator 201. An operational amplifier 202 constitutes a voltage follower buffer whose output terminal and negative phase input terminal are shorted and that transmits as a first comparison voltage the output voltage VC1 from the integrator 21 to the subsequent stage. The first comparison voltage VC1 output from the voltage follower buffer is supplied to the negative phase input terminal of the operational amplifier 203 via a resistor R22. A resistor 23 having the same resistance value as the resistor 22 is inserted between the negative phase input terminal and the output terminal of the operational amplifier 203. A reference level +VB/2 is supplied to the positive phase input terminal of the operational amplifier 203. Assuming that the output voltage of the operational amplifier 203 is VC2, the following equation is obtained:

$$(VC1+VC2)/2 = VB/2 \quad (1)$$

Solving the equation in terms of VC2 obtains:

$$VC2 = VB - VC1 \quad (2)$$

That is, a circuit comprising the resistors R22 and R23 and an operational amplifier 203 works as an inverted amplifier for outputting a second comparison voltage VC2 lower than the voltage VB by the voltage VC1 in case the first comparison voltage VC1 is output from the operational amplifier 202.

The comparator 204 compares the first comparison voltage VC1 with the triangular wave signal TR. In case the latter is higher than the former, the comparator 204 outputs a High signal. Otherwise, the comparator 204 outputs a Low signal. The comparator 205 compares the second comparison voltage VC2 with the triangular wave signal TR. In case the latter is higher than the former, the comparator 205 outputs a High signal. Otherwise, the comparator 205 outputs a Low signal. A Low-active OR gate 206 outputs an attenuation command signal SW that is set High (active) when at least one of the outputs from the comparators 204 and 205 is Low.

This is the end of the detailed description of the class D amplifier according to this embodiment.

Figure 3:
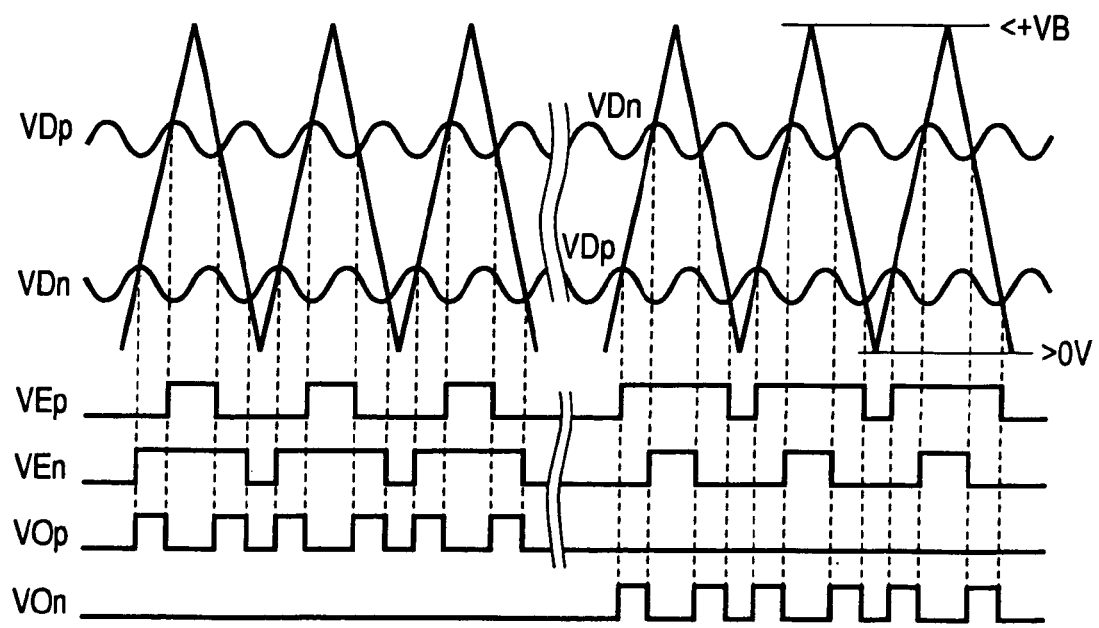
FIG. 3 is a waveform chart showing the operation of the first embodiment.

Next, operation of this embodiment will be described. FIG. 3 is a waveform chart showing the waveform of each part of the amplifier 100. The error integrator 110 integrates the errors between the input analog signals and output analog signals of the amplifier 100. Thus, the waveforms of the output signals VDp and VDn are like those of the input analog signals VIp and VIn with ripples corresponding to the output digital signals superimposed thereon. The pulse-width modulator 120 compares the output signals VDp and VDn from the error integrator 110 with the triangular wave signal TR. In the period when VDp>VDn, as shown in the left half of FIG. 3, the digital signal VOp is kept High in a period from when the level of the triangular wave signal TR exceeds the level of the signal VDn to when the level of the triangular wave signal TR reaches the level of the signal VDp and in a period from when the level of the triangular wave signal TR lowers the level of the signal VDn to when the level of the triangular wave signal TR drops to the level of the signal VDn and the digital signal VOn is kept Low continuously. In the period when VDn>VDp, as shown in the right half of FIG. 3, the digital signal VOn is kept High in a period from when the level of the triangular wave signal TR exceeds the level of the signal VDp to when the level of the triangular wave signal TR reaches the level of the signal VDn and in a period from when the level of the triangular wave signal TR lowers the level of the signal VDn to when the level of the triangular wave signal TR drops to the level of the signal VDp and the digital signal VOp is kept Low continuously. In this way, the pulse-width modulator 120 generates digital signals VOp and VOn having a pulse width proportional to the level difference between the positive and negative phase output signal VDp and VDn from the error integrator 110.

In this embodiment, the triangular wave signal TR changes within a range between 0V and +VB. In order to obtain as pulse trains the output signals VOp and VOn without generating clip, both output signals VDp and VDn from the error integrator 110 must be within the range at which terminals that output signals cross the triangular wave signal TR. In case the amplitudes of the input analog signal VIp and VIn are within a proper range, the output signals VDp and VDn from the error integrator 110 fall within the range of the amplitude of the triangular wave signal TR. In case the input analog signals VIp and VIn whose amplitudes substantially deviate from the proper range are supplied to the class D amplifier, the output signal VDp or VDn from the error integrator 110 deviates from the range of the amplitude of the triangular wave signal TR thus causing a clip state where the output digital signal VOp or VOn is continuously kept High. Note that, in this embodiment, the clip is prevented by the clip prevention controller 200. This operation will be described referring to FIGS. 4A and 4B. Incidentally, the proper range of the amplitudes of the input analog signal VIp and VIn is a range within which a clip does not occur at the output digital signals VOp and Von, and is a range smaller than a value which is obtained by dividing the half of the power voltage of the output portion (for example, the inverters 127p and 127n of FIG. 1) of the class D amplifier by the gain of the class D amplifier.

Figure 4A:
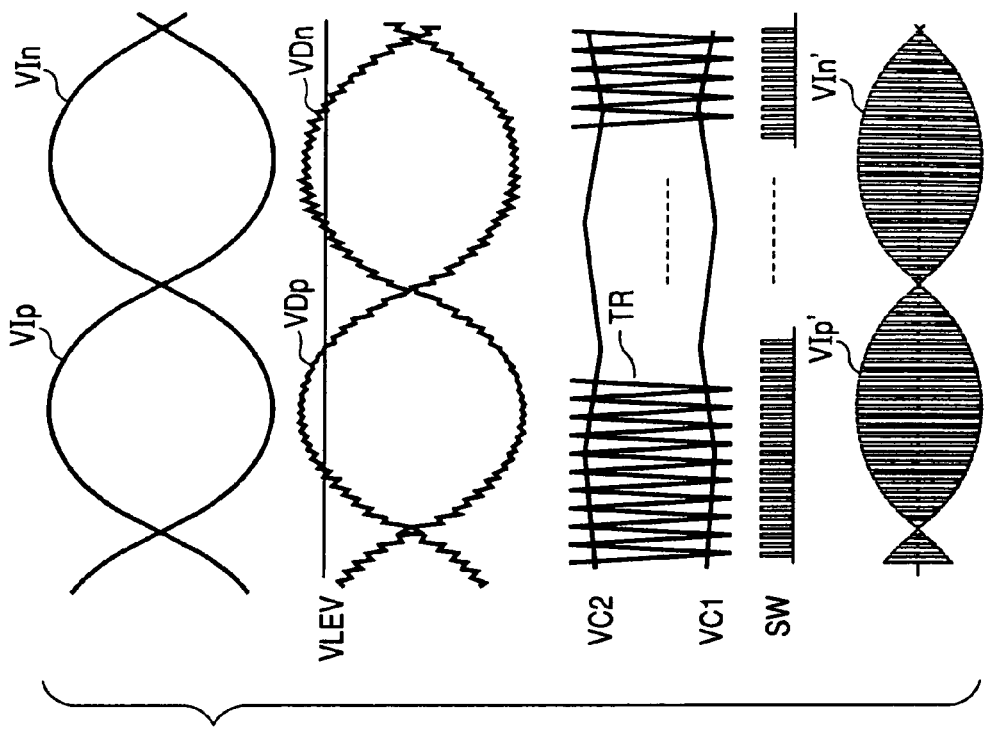
FIGS. 4A and 4B are waveform charts showing the operation of the first embodiment.

As shown in FIG. 4A, in case the amplitude of each of the input analog signals VIp and VIn is within the proper range and the maximum value of each of the output signals VDp and VDn is below the reference level VLEV, the output current from the current output comparator 201 is 0, the first comparison voltage VC1 is 0V, and the second comparison voltage VC2 is +VB. Thus, the triangular wave signal TR dose not cross the comparison voltages VC1 and VC2 and the attenuation command signal SW is continuously set Low as an inactive level. Thus, the switch 130 is kept OFF. The waveforms of the analog signals VIp' and VIn' at the terminals of the switch 130 are similar to those of the input analog signals VIp and VIn as shown in FIG. 4A.

Figure 4B:
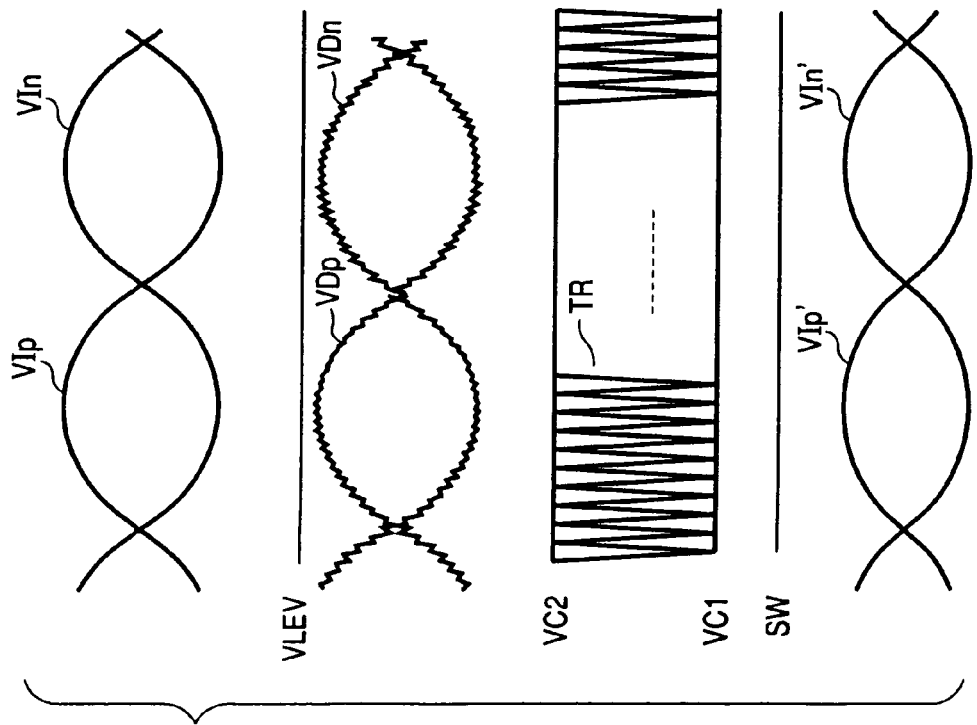

As shown in FIG. 4B, in case the amplitude of each of the input analog signals VIp and VIn increases and at least one of the output signals VDp and VDn from the error integrator 110 exceeds the reference level VLEV, a constant current is output from the current output comparator 201 while the signal VDp or VDn exceeds the reference level VLEV. The constant current recharges the capacitor C21. Output of the constant current and recharging of the capacitor C21 by the current output comparator 201 are made each time the signal VDp or VDn exceeds the reference level. As a result, the first comparison voltage VC1 changes in a pulsating manner as described below. The first comparison voltage VC1 rises when the signal VDp or VDn has exceeded the reference level. Afterwards, the first comparison voltage VC1 drops as the stored electric charges are discharged via the resistor R21 until the signal VDp or VDn exceeds the reference level the next time. As the first comparison voltage VC1 shows such a behavior, the second comparison voltage VC2 (=VB−VC1) drops from the voltage VB and repeats the same pulsation as the voltage VC1. As a result, the triangular wave signal TR crosses the comparison voltages VC1 and VC2. The attenuation command signal SW that is set High in a period when the triangular wave signal TR is lower than the voltage VC1 and a period when the triangular wave signal TR is higher than the voltage VC2 is output from the Low-active OR gate 206.

The switch 130 is turned OFF while the attenuation command signal SW is Low and turned ON while the attenuation command signal SW is High. In a period when the attenuation command signal SW is Low, the analog signals VIp' and VIn' at the terminals of the switch 130 shows signal values corresponding to the original input analog signals VIp and Vin. In a period when the attenuation command signal SW is High, the analog signals VIp' and VIn' are 0V. The analog signals VIp' and VIn' show waveforms thinned at predetermined time intervals as illustrated. An analog signal substantially input to the error integrator 110 is attenuated and the level of the output signal from the error integrator 110 falls within the proper range of 0V to +VB, thereby preventing clip on the output digital signals VOp and VOn.

Specifically, in the situation where the amplitudes of the input analog signals VIp and Vin are large and such thinning is made, as the amplitudes of the input analog signals VIp and Vin become larger and the amplitude of the output signals VDp and VDn of the error integrator 110 become larger accordingly, thinning ratio is increased and the gain of the entire class D amplifier is decreased, that is, a so-called negative feedback control is made. As a result of such a negative feedback control, the input analog signals VIp and VIn are amplified without generating distortion. When the input analog signals VIp and VIn each has reached a peak level, the gain of the entire class D amplifier is adjusted to an optimum value so that the pulse width modulation factor of the output digital signal VOp or VOn will reach a certain upper limit value. Thus, in this embodiment, in a region where the amplitudes of the input analog signals VIp and Vin are larger than the proper range, an output signal waveform (an waveform obtained by integrating the output digital signals VOp and VOn) given to a load is not distorted and the peak level of the output signal waveform maintains a certain value even in case the amplitudes of the input analog signals VIp and Vin have increased.

The upper limit value of the pulse modulation factor of the output digital signal VOp or VOn depends on the reference level VLEV. The reason is described below. In the class D amplifier of this embodiment, the pulse modulation factor of each of the output digital signals VOp and VOn is determined according to the level of each of the output signals VDp and VDn of the error integrator 110. When the output signals VDp and VDn of the error integrator 110 have exceeded the reference level VLEV, a comparison voltage at a level intersecting a triangular wave signal TR is generated and an attenuation command signal SW for thinning is then generated. This suppresses an increase in the level of the output signals VDp and VDn of the error integrator 110 and a corresponding increase in the pulse width modulation factor.

The response characteristic to the clip in this embodiment is adjustable by adjusting the capacitance value of the capacitor C21 and the resistance value of the resistor R21. A smaller capacitance value of the capacitor C21 will be helpful when it is necessary to generate the attenuation command signal SW in a short time in response to the occurrence of clip. A greater resistance value of the resistor R21 will be helpful when it is necessary to prolong a time until the attenuation command signal SW is halted after clip is eliminated.

As described above, according to this embodiment, in case the amplitude of an input analog signal to a class D amplifier is increased and deviates from a proper range, an analog signal input to the error integrator 110 is intermittently thinned on a time axis, thus preventing occurrence of clip. In this case, the analog signal input to the error integrator 110 is thinned only intermittently so that the resulting waveform is substantially unchanged. In this way, according to this embodiment, it is possible to prevent occurrence of clip without generating nonlinear distortion.

In this embodiment, as mentioned above, the negative feedback control is made by thinning in a region where the amplitude of an input analog signal is larger than the proper range. Ideally, it is thus possible to amplify the input analog signals VIp and VIn s as not to clip the output signal waveform even in case the amplitudes of the input analog signal VIp and VIn have reached the infinity. In reality, an input protection circuit is provided in case a class D amplifier is implemented as a semiconductor integrated circuit. In case the amplitudes of the input analog signal VIp and VIn exceeds the source voltage range, the input analog signals VIp and VIn are clipped when these signals passes through the input protection circuit. In this case, the class D amplifier amplifies the clipped input analog signals VIp and VIn. In the meantime the class D amplifier performs amplification through thinning-based negative feedback control so that the class D amplifier gives no additional distortion to the input analog signals VIp and VIn.

Second Embodiment

Figure 5:
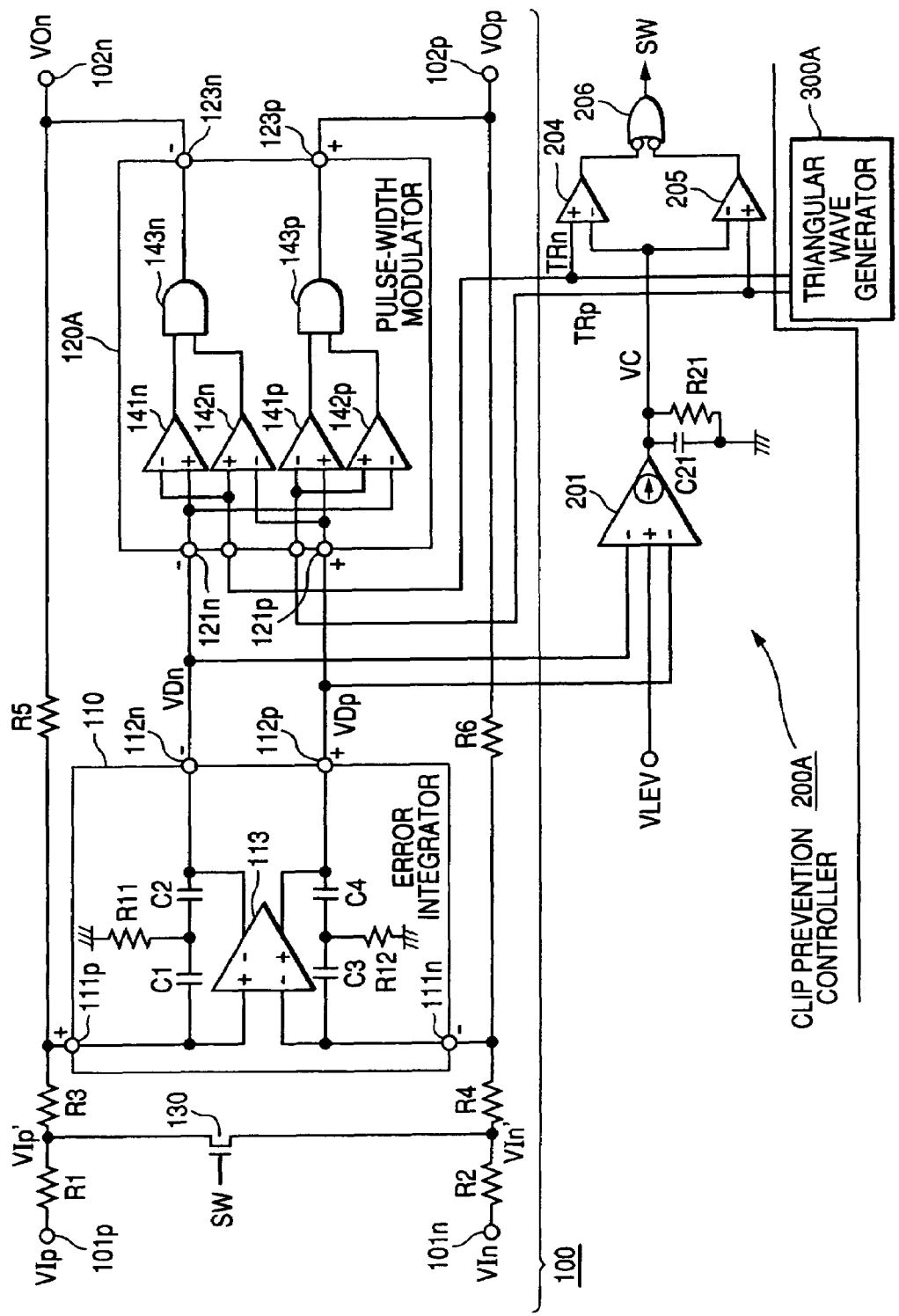
FIG. 5 is a circuit diagram showing the configuration of a class D amplifier according to the second embodiment of the invention.

FIG. 5 is a circuit diagram showing the configuration of a class D amplifier according to the second embodiment of the invention. In the first embodiment (FIG. 1), the output current from the current output comparator 201 is used to generate two comparison voltages VC1 and VC2 crossing the triangular wave signal TR on the higher voltage side and on the lower voltage side. By supplying the first comparison voltage VC1 and the triangular wave signal TR to the comparator 204 and the second comparison voltage VC2 and the triangular wave signal TR to the comparator 205, the attenuation command signal SW as a pulse train is generated.

In this embodiment, the triangular wave generator 300 in the first embodiment is replaced with a triangular wave generator 300A for outputting positive phase and negative phase triangular wave signals TRp and TRn. Accordingly, the pulse-width modulator 120 in the first embodiment is replaced with a pulse-width modulator 120A for performing pulse-width modulation by using positive phase and negative phase triangular wave signals TRp and TRn. In the pulse-width modulator 120A, a comparator 141p outputs a High signal when the instantaneous value of the triangular wave signal TRp is lower than that of the output signal VDp of the error integrator 110. A comparator 142p outputs a High signal when the instantaneous value of the triangular wave signal TRp is higher than that of the output signal VDn of the error integrator 110. In a period when the output signals of the comparators 141p and 142p are set High, that is, VDp>VDn, an AND gate 143p maintains the digital signal VOp High in a period from when the instantaneous value of the triangular wave signal TRp exceeds the signal VDn to when it reaches the signal VDp, and in a period when the instantaneous value of the triangular wave signal TRp drops below the signal VDp to when it reaches the signal VDn. The comparator 141n outputs a High signal when the instantaneous value of the triangular wave signal TRn is lower than that of the output signal VDn of the error integrator 110. The comparator 142n outputs a High signal when the instantaneous value of the triangular wave signal TRn is higher than that of the output signal VDn of the error integrator 110. In a period when the output signals of the comparators 141n and 142n are set High, that is, VDn>VDp, an AND gate 143n maintains the digital signal VOn High in a period from when the instantaneous value of the triangular wave signal TRn exceeds the signal VDp to when it reaches the signal VDn, and in a period when the instantaneous value of the triangular wave signal TRn drops below the signal VDn to when it reaches the signal VDp. That is, in the pulse-width modulator 120A, same as the pulse-width modulator 120 in the first embodiment, digital signals VOp and VOn each having a pulse width proportional to the level difference between the positive phase and negative phase output signals VDp and VDn of the error integrator 110.

In this embodiment, as the triangular wave signal generators 300A for outputting the positive phase and negative phase triangular wave signals TRp and TRn is introduced, the clip prevention controller 200 in the first embodiment is replaced with the simpler clip prevention controller 200A. In this embodiment, an output voltage VC of the current output comparator 201 is given to the opposite-phase input terminals of the comparators 204 and 205. To the positive phase input terminal of the comparator 204 is given a negative phase triangular wave signal TRn and to the positive phase input terminal of the comparator 205 is given a positive phase triangular wave signal TRp.

With this configuration, when the output signal VDp or VDn from the error integrator 110 exceeds the reference level VLEV and the output voltage from the current output comparator 201 rises, the output signal from the comparator 204 is set Low and the attenuation command signal SW is set High in a period when the level of the triangular wave signal TRp is lower than the voltage VC, and the output signal from the comparator 205 is set Low and the attenuation command signal SW is set High in a period when the level of the triangular wave signal TRn is lower than the voltage VC. This obtains the same working effect as the first embodiment. The second embodiment is advantageous in that the amplifier 202, resistors R22 and R23, and amplifier 203 required to obtain the two comparison voltages VC1 and VC2 in the first embodiment are no longer necessary and the circuit scale can be reduced accordingly.

Third Embodiment

Figure 6:
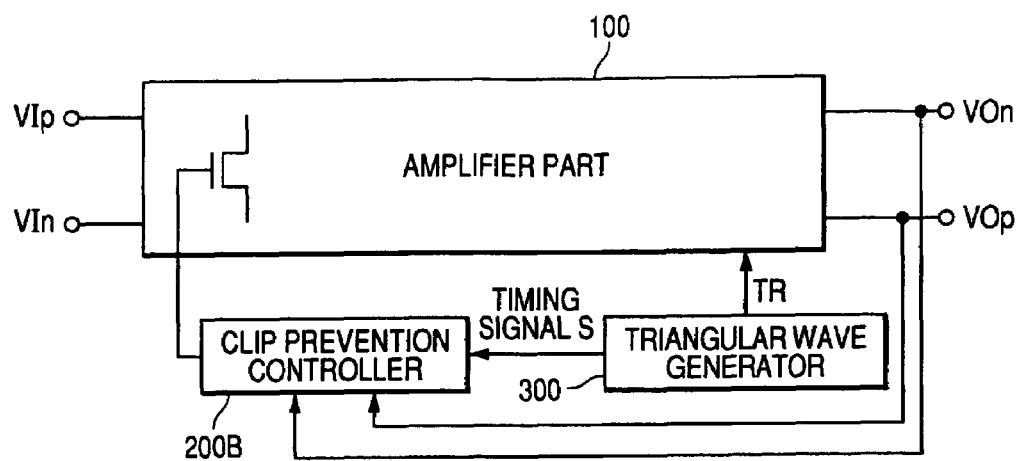
FIG. 6 is a circuit diagram showing the configuration of a class D amplifier according to the third embodiment of the invention.

FIG. 6 is a block diagram showing the configuration of a class D amplifier according to the third embodiment of the invention. In this embodiment, the clip prevention controller 200 in the first embodiment is replaced with a clip prevention controller 200B. In this embodiment, a pulse-shaped timing signal S is supplied to the clip prevention controller 200B from the triangular wave generator 300 with the timing the triangular wave signal TR is at the positive peak and the timing the triangular wave signal TR is at the negative peak.

In case clip is absent, as understood from FIG. 3, the output digital signals VOp and VOn obtained with the timing the triangular wave signal TR is at the positive peak and the timing the triangular wave signal TR is at the negative peak are Low. When clip occurs, the output digital signal VOp or VOn obtained with the timing the triangular wave signal TR is at the positive peak and the timing the triangular wave signal TR is at the negative peak is High. The clip prevention controller 200B according to this embodiment uses this behavior to detect presence/absence of clip based on the output digital signals VOp and VOn and generates the attenuation command signal SW that eliminates the clip once the clip is detected.

Figure 7A:
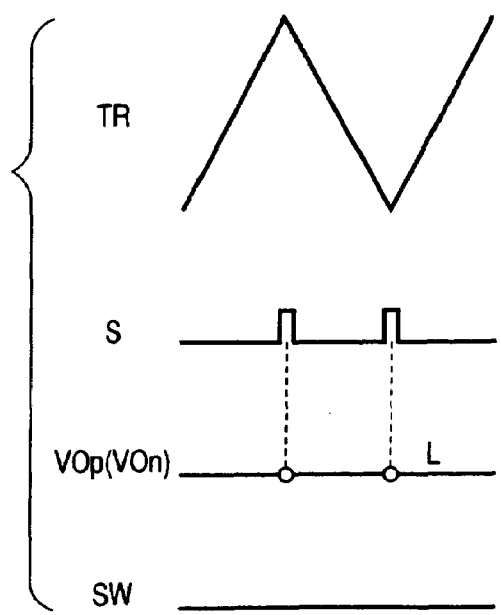
FIGS. 7A and 7B are waveform charts showing the operation of the third embodiment.
Figure 7B:
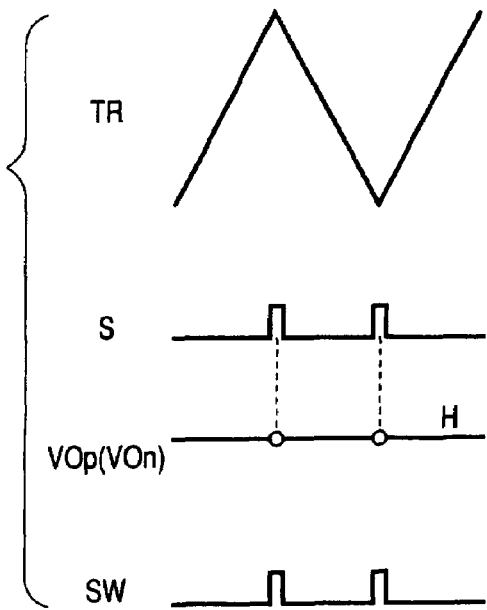

FIGS. 7A and 7B are waveform charts showing the operation of this embodiment. In the example shown in FIG. 7A, the output digital signals VOp and VOn obtained when the timing signal S is generated are Low. The clip prevention controller 200B thus determines absence of clip and sets the attenuation command signal SW Low. In the example shown in FIG. 7B, the output digital signal VOp or VOn obtained when the timing signal S is generated is High. The clip prevention controller 200B thus determines presence of clip and outputs a pulse train synchronous with the triangular wave signal TR as the attenuation command signal SW. As a result, same as the first embodiment, the input analog signal to the amplifier part 100 is intermittently thinned on a time axis thus preventing occurrence of clip.

The third embodiment may have the following variant. That is, the timing signal S is generated slightly before the triangular wave signal TR is at its positive peak and slightly before the timing signal S is at its negative peak. With this approach, the input analog signal to the amplifier part 100 is intermittently thinned on a time axis before clip appears on the output digital signals VOp and VOn, thus reliably preventing occurrence of clip.

Fourth Embodiment

Figure 8:
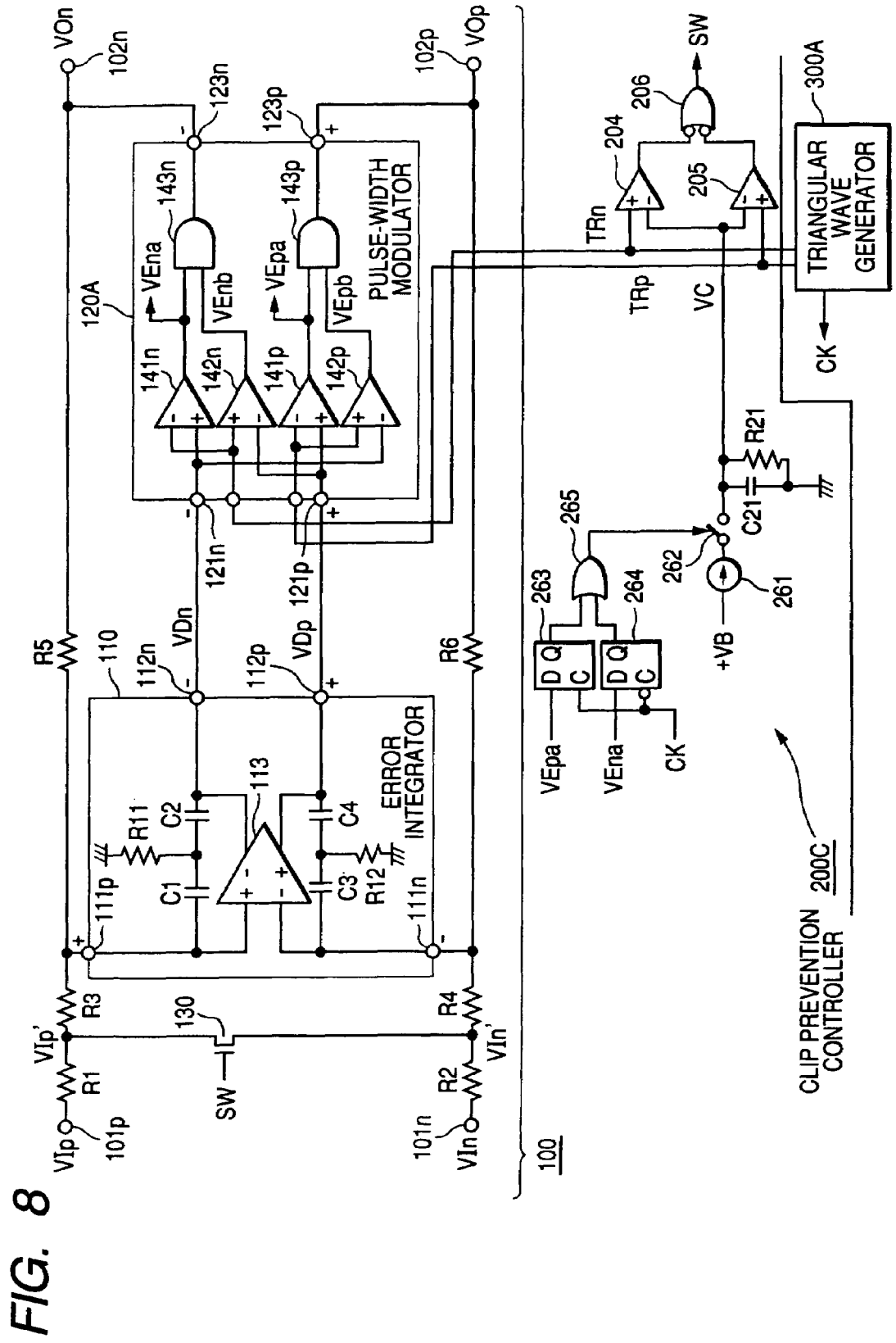
FIG. 8 is a circuit diagram showing the configuration of a class D amplifier according to the fourth embodiment of the invention.

FIG. 8 is a block diagram showing the configuration of a class D amplifier according to the fourth embodiment of the invention. In this embodiment, same as the second embodiment (FIG. 5), the triangular wave generator 300A for generating the positive phase and negative phase triangular wave signal TRp and TRn is used. Connection of the triangular wave generator 300A with the pulse-width modulator 120 in the amplifier part 100 is the same as that in the second embodiment. In this embodiment, the clip prevention controller 200 in the second embodiment is replaced with the clip prevention controller 200C. In the clip prevention controller 200C, the current output comparator 201 in the clip prevention controller 200A (FIG. 5) is replaced with a circuit including a constant current source 261, a switch 262, flip-flops 263 and 264, and a OR gate 265 so that a current supplied from the constant current source 261 via the switch 262 will recharge the capacitor C21.

A clock CK is supplied to each clock terminal of the flip-flops 263 and 264. The clock CK is a signal used for timing control of the triangular wave signals TRp and TRn in the triangular wave generator 300A. On the rising edge of the clock CK, the triangular wave signal TRp (TRn) is at its positive peak (negative peak). On the falling edge of the clock CK, the triangular wave signal TRp (TRn) is at its negative peak (positive peak). The flip-flop 263 fetches and holds the output signal VEpa from the comparator 141p in the pulse-width modulator 120A on the rising edge of the clock CK. The flip-flop 264 fetches and holds the output signal VEnp from the comparator 141n in the pulse-width modulator 120A on the falling edge of the clock CK. The OR gate 265 turns ON the switch 261 when at least one of the signals held by the flip-flops 263 and 264 is Low.

Figure 9:
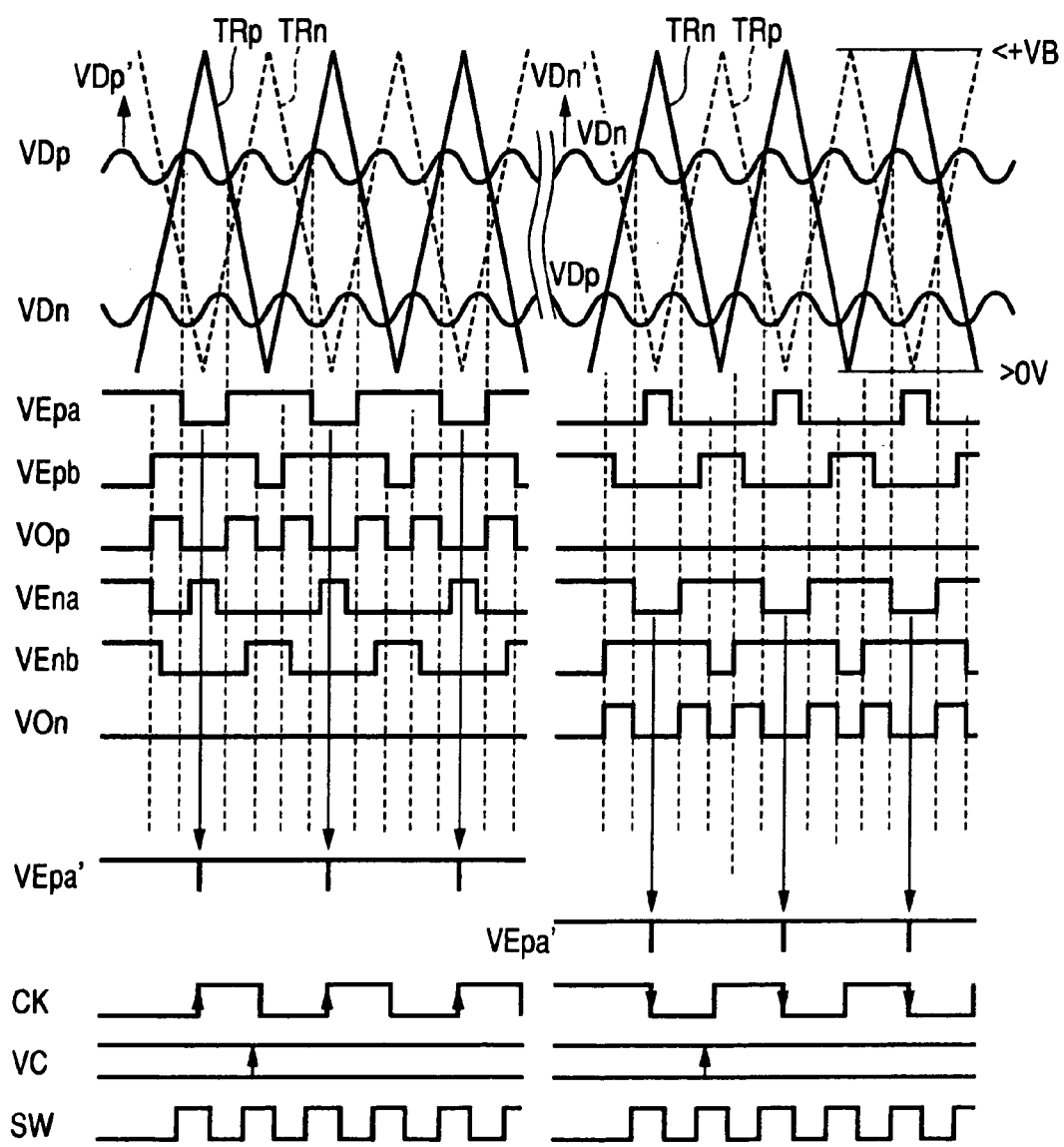
FIG. 9 is a waveform chart showing the operation of the fourth embodiment.

FIG. 9 is a waveform chart showing the operation of this embodiment. In the pulse-width modulator 120A, the output signal VEpb of the comparator 142p is set High in a period when the triangular wave signal TRp exceeds the level of the signal VDn. The output signal VEpa of the comparator 141p is set Low in a period when the triangular wave signal TRp exceeds the level of the signal VDp. In the pulse-width modulator 120A, the output signal VEnb of the comparator 142n is set High in a period when the triangular wave signal TRn exceeds the level of the signal VDp. The output signal VEna of the comparator 141n is set Low in a period when the triangular wave signal TRp exceeds the level of the signal VDn.

Thus, in case the levels of the output signals VDp and VDn of the error integrator 110 are within a proper range and VDp>VDn, the AND gate 143p maintains the digital signal VOp High in a period from when the triangular wave signal TRp exceeds the signal VDn to when it reaches the signal VDp and in a period when the triangular wave signal TRp drops below the signal VDp to when it reaches the signal VDn in the pulse-width modulator 120A. In case the levels of the output signals VDp and VDn of the error integrator 110 are within a proper range and VDn>VDp, the AND gate 143n maintains the digital signal VOn High in a period from when the triangular wave signal TRn exceeds the signal VDp to when it reaches the signal VDn and in a period from when the triangular wave signal TRn drops below the signal VDn to when it reaches the signal VDp in the pulse-width modulator 120A.

As shown in the left part of FIG. 9, when the level of the output signal VDp of the error integrator 110 reaches the level VDp' close to the positive peak of the triangular wave signal TRp, the signal VEpa has its pulse width narrowed as shown by the signal VEpa' in the figure. When the amplifier 100 is in the clip or near-clip state and the signal VEpa is set High on the rising edge of the clock CK, a High signal is output from the flip-flop 263. The switch 262 is turned ON and the charging voltage VC of the capacitor C21 rises as illustrated, and the pulse-shaped attenuation command signal SW is output, thus preventing occurrence of clip.

As shown in the right part of FIG. 9, when the level of the output signal VDn of the error integrator 110 reaches the level VDn' close to the positive peak of the triangular wave signal TRn, the signal VEna has its pulse width narrowed as shown by the signal VEna' in the figure. When the amplifier 100 is in the clip or near-clip state and the signal VEna is set High on the falling edge of the clock CK, a High signal is output from the flip-flop 264. The switch 262 is turned ON and the charging voltage VC of the capacitor C21 rises as illustrated, and the pulse-shaped attenuation command signal SW is output, thus preventing occurrence of clip.

This embodiment obtains the same working effect as each of the preceding embodiments. The fourth embodiment may have the following variant. That is, the rising timing and falling timing of the clock CK supplied to the flip-flops 263 and 264 are slightly delayed with respect to a peak of the triangular wave signal TRp or TRn. With this approach, the attenuation command signal SW is generated just before occurrence of clip, or in other words, when the pulse width of the negative pulses as signals VEn and VEp synchronous with the peak timing of the triangular wave signals TRp and TRn has become extremely narrow. This previously avoids occurrence of clip. In this case also, as a result of the negative feedback similar to that in the foregoing embodiments, the input analog signals VIp and VIn are amplified without being distorted. When the input analog signals VIp and VIn each has reached a peak level, the gain of the entire class D amplifier is adjusted to an optimum value so that the pulse width modulation factor of the output digital signal VOp or VOn will reach a certain upper limit value (just before occurrence of clip) slightly lower than 100 percent.

Fifth Embodiment

Figure 10:
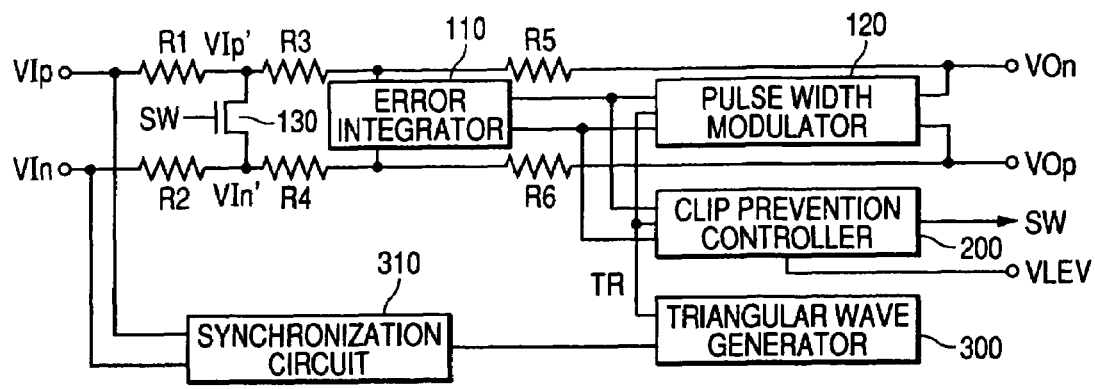
FIG. 10 is a block diagram showing the configuration of a class D amplifier according to the fifth embodiment of the invention.
Figure 11:
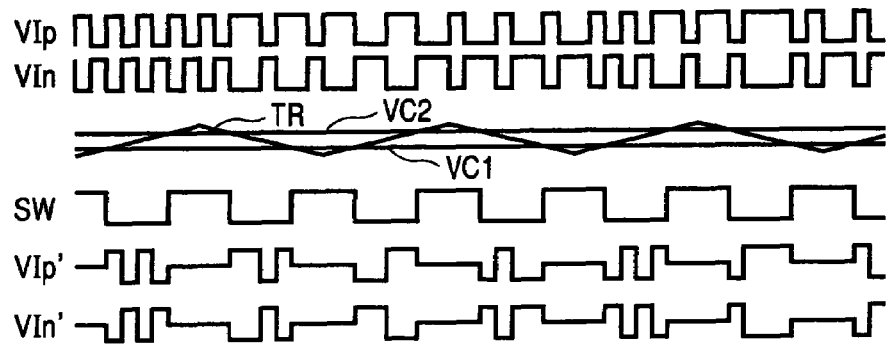
FIG. 11 is a waveform chart showing the operation of the fifth embodiment.

FIG. 10 is a circuit diagram showing the configuration of a class D amplifier according to the fifth embodiment of the invention. FIG. 11 is a waveform chart showing the operation of the fifth embodiment. In the foregoing embodiments, positive phase and negative phase input analog signals VIp and VIn are given to a class D amplifier. In this embodiment, as shown in FIG. 11, positive phase and negative phase bit streams each being a single-bit digital signal are given as input signals VIp and VIn to a class D amplifier. In this embodiment, as shown in FIG. 10, in order to appropriately process the bit streams VIp and VIn, a synchronization circuit 310 for synchronizing the phase of a triangular wave signal TR output from the triangular wave signal generator 300 with the bit streams VIp and VIn is added to the class D amplifier of the first embodiment.

In this embodiment, in case the input signals is a bit stream, the error integrator 110 integrates the errors between the output signals VOp and VOn and the input signals VIp and VIn and the pulse-width modulator 120 generates pulse-width-modulated digital signals VOp and VOn based on the signals VDp and VDn indicating the integration result in a similar fashion as the first embodiment. In this embodiment, it is possible to apply, to a load (not shown), a signal having the same waveform as the analog signal waveform of the bit streams VIp and VIn. In the situation that the peak of the signal waveform of the bit streams VIp and VIn rises and clip is likely to occur, the first comparison voltage VC1 and the second comparison voltage VC2 repeat pulsation and the attenuation command signal SW is intermittently generated, same as the first embodiment. In this way, the input signals VIp' and VIn' given to the error integrator 110 becomes signals in which the input signals VIp' and VIn' are thinned by bit streams VIp and VIn, thus occurrence of clip is prevented. While the class D amplifier of the first embodiment has been modified to provide a class D amplifier of this embodiment, the class D amplifier of any other embodiment may be similarly modified to provide a class D amplifier of this embodiment.

Sixth Embodiment

Figure 12:
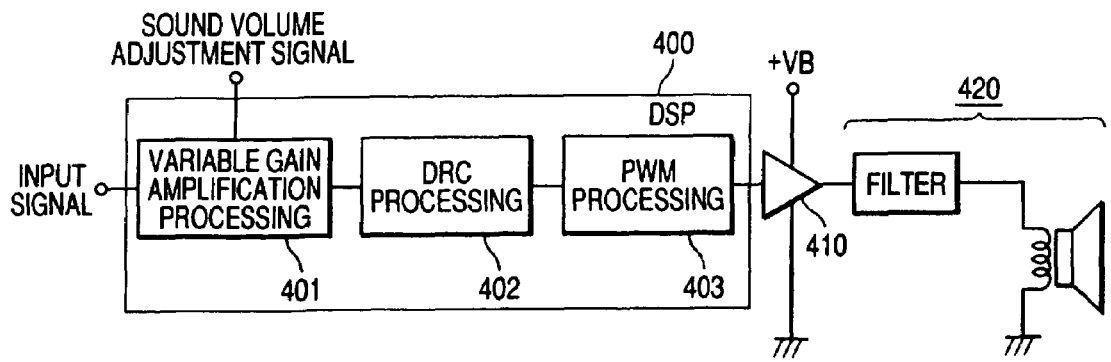
FIG. 12 is a block diagram showing the configuration of a class D amplifier according to the sixth embodiment of the invention.

FIG. 12 is a circuit diagram showing the configuration of a class D amplifier according to the sixth embodiment of the invention. The class D amplifier includes a DSP (Digital Signal Processor) 400 for generating a pulse-width-modulated digital signal according to an input signal by way of digital signal processing and a switching amplification stage 410 switched by a digital signal output from the DSP 400 for driving a load 420 composed of a filter and a loudspeaker based on the poser supplied from a power source +VB. As an input signal, an analog audio signal obtained from an audio source may be given to an A/D converter and a digital signal obtained from the A/D converter may be given to the DSP 400, or a digital audio signal received from external device may be directly given to the DSP 400.

The DSP 400 performs variable gain amplification processing 401 as a gain controller, DRC (Dynamic Range Compression) processing 402 in order to obtain a pulse-width-modulated digital signal and PWM processing 403 as a pulse generator. Such processing is signal processing that pertains to digital processing of a predetermined number of bits (for example m bits).

Figure 13:
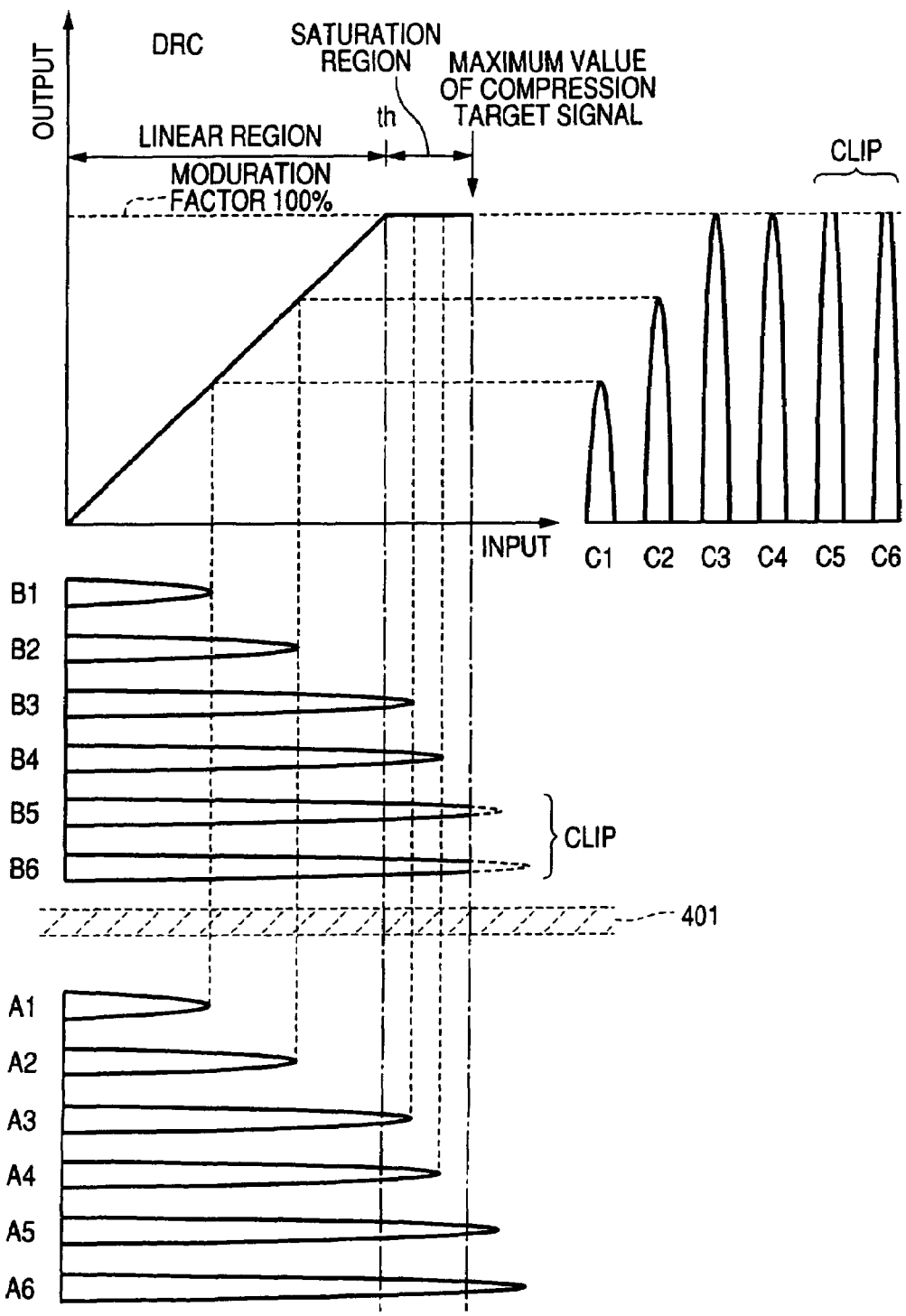
FIG. 13 is a waveform chart showing the operation of the sixth embodiment.

FIG. 13 shows the waveforms of compression target signals B1 to B6 output from the variable gain amplification processing 401 and the waveforms of modulating signals C1 to C6 output by the DRC processing 402 in case sine wave signals A1 to A6 having various peak levels are given as input signals to the DSP 400. In FIG. 13, an analog signal is shown that is equivalent to a digital signal passing through processes of DSP 400. In order to prevent complicated illustration, the waveform of each signal is shown for half cycle only. The processes performed by the DSP 400 will be described referring to FIG. 13.

In the variable gain amplification processing 401, an input signal is amplified with a variable gain and the resulting signal is passed to the DRC processing 402. The gain in the variable gain amplification processing 401 is set according to a sound volume adjustment signal generated depending on the operation of an operator such as a volume control. The compression target signal obtained by the variable gain amplification processing 401 is an m-bit digital signal and a value that can be represented by this signal has an upper limit. To obtain a distortion-free compression target signal from an input signal in the variable gain amplification processing 401, there must be an appropriate relationship between the peak level of the input signal and the gain used when amplifying the input signal so that the result of amplification of the input signal will not exceed a maximum value represented by an m-bit digital signal, for example an instantaneous value represented by a digital signal with m bits all "1". In case the peak level of an input signal falls with a proper range appropriate for amplification using a gain set according to a sound volume adjustment signal, the input signal is amplified without being distorted and a compression target signal having a similar waveform to that of the input signal is obtained (in the illustrated example, compression target signals B1 to B4 corresponding to input signals A1 to A4). In case the peak level of an input signal exceeds the proper range, the compression target signal obtained by the variable gain amplification processing 401 will be saturated at the maximum value that can be represented by the m-bit digital signal and accordingly clipped (in the illustrated example, compression target signals B5 and B6 corresponding to input signals A5 and A6).

In the DRC processing 402, the compression target signal obtained by the variable gain amplification processing 401 as a preceding process undergoes dynamic range compression and the resulting signal is output as a modulating signal to PWM processing 403 as a pulse generator. The modulating signal is an m-bit digital signal. This m-bit modulating signal can represent the modulation factor in the range of 0 to 100 percent. In the PWM processing 403, a pulse-width-modulated pulse is generated with the modulation factor indicated by the modulation signal and the pulse is output as a digital signal to the switching amplification stage 410.

FIG. 13 shows an input/output characteristic as a relationship between the peak level of a compression target signal given to the DRC processing 402 and the peak level of a modulating signal obtained by the DRC processing 402. As illustrated, the input/output characteristic of the DRC processing 402 is divided into a linear region and a saturation region. The linear region is a region below a threshold th at the peak level of the compression target signal. In the linear region, the compression target signal is amplified with a predetermined gain to generate a modulating signal having a peak level proportional to that of the compression target signal (in the illustrated example, modulating signals C1 and C2 corresponding to compression target signals B1 and B2). In this embodiment, the gain in the linear region is determined so that a modulation signal having a peak level indicating a modulation factor of 100 percent may be obtained when a compression target signal having a peak level corresponding to the threshold th is given. The saturation region is a region where the peak level of a compression target signal is equal to or above the threshold th. In the saturation region, the peak level of a modulating signal has reached a value indicating a modulation factor of 100 percent. In the DRC processing 402, the gain used when amplifying a compression target signal is decreased according to an increase in the peak level of the compression target signal so that the peak level of the modulating signal obtained by amplifying the compression target signal maintains the value indicating a modulation factor of 100 percent (in the illustrated example, modulating signals C3 to C6 corresponding to compression target signals B3 to B6). To be more precise, a value obtained by dividing the value of a modulating signal indicating a modulation factor of 100 percent by the peak level of the compression target signal is used as a gain used when amplifying a compression target signal.

In the example shown in FIG. 13, modulating signals C5 and C6 each has its waveform clipped. The clip is not generated in the DRC processing 402 but is inherent to the compression target signals B5 and B6 given to the DRC processing 402. The DRC processing 402 amplifies a compression target signal with an appropriate gain corresponding to the peak level of the compression target signal to be input and generates a modulating signal having a similar waveform to that of the compression target signal. As a result, the DRC processing 402 is accompanied by no distortion.

In this embodiment, the variable gain amplification processing 401 is provided as a sound volume adjustment unit. In an ordinary power amplifier, such sound volume adjustment unit is provided in the final stage of a power amplifier (switching amplification stage subsequent to a PWM modulator in the case of a class D amplifier). In this embodiment, the variable gain amplification processing 401 as a sound volume adjustment unit is provided before the DRC processing 402. This is one of the features of this embodiment. In this embodiment, it is possible to engage a class D amplifier to perform various operations described below by adjusting the gain of the variable gain amplification processing 401 provided before the DRC processing 402.

(1) The gain of the variable gain amplification processing 401 is adjusted so as to allow amplification to be made using the linear region and the saturation region. By adjusting the gain in this way, the DRC processing 402 in the linear region is executed and sound reflecting the contract of sound volume is reproduced from a loud speaker when the sound volume of an input signal is relatively small. When the sound volume of an input signal is relatively large, the DRC processing 402 is executed in the saturation region to reproduce sound at a certain comfortable volume and without clip from a loudspeaker.

(2) In case choice is made from audio signals from multiple sources and an audio signal is reproduced on a class D amplifier, the gain of the variable gain amplification processing 401 is increased/decreased in switching between sources to be reproduced so that the DRC processing 402 may occur in the saturation region when reproduction starts. With this approach, irrespective of the audio signal of the target source, the peak level of the output signal of a class D amplifier is maintained constant, thereby absorbing the sound level difference between sources.

(3) In case there is a need to enhance the maximum output of a class D amplifier at a cost of some degree of distortion, the gain is increased and distortion is generated within a permissible range in the variable gain amplification processing 401 to engage a class D amplifier to perform amplification using the linear region and the saturation region. In this case, clip occurs on the waveform of a modulating signal given to the PWM processing 403 and the waveform of a signal finally output from the class D amplifier. The then output signal of the class D amplifier has higher energy than the signal without clip. Thus, the maximum output of the class D amplifier is higher than when clip does not take place.

Also in the class D amplifiers according to the first through fifth embodiments, clip occurs on the output signal waveform when the peak level of the input signal exceeds the range of source voltage. Thus, also in the class D amplifiers according to the first through fifth embodiments, it is possible to enhance the maximum output of a class D amplifier at a cost of distortion in a permissible range.

(4) EIAJ (Electronic Industries Association of Japan) specifies that the output of an amplifier assumed when the distortion factor is 10 percent at an arbitrary load resistance value is indicated as a maximum commercial output. Under the conditions specified by EIAJ, measurement is made to obtain the maximum output of a class D amplifier. To be more specific, a sine wave of 1 kHz is given as an input signal to a class D amplifier and the gain of the variable gain amplification processing 401 is adjusted so that the distortion factor of a compression target signal will be 10 percent, and the output of the class D amplifier then obtained is measured. In this way, according to this embodiment, it is possible to measure the maximum output of a class D amplifier under the conditions specified by EIAJ and indicate the measured output. This provides users with objective and persuasive information on the maximum output of a class D amplifier.

OTHER EMBODIMENTS

While the first to sixth embodiments of the invention have been described, the invention has other embodiments described below.

While the first to fourth embodiments of the invention have been described, the invention has other embodiments described below.

(1) While the invention is applied to a class D amplifier for outputting a digital signal pulse-width-modulated according to an input analog signal in the foregoing embodiments, the invention is also applicable to a class D amplifier for applying $\Delta\Sigma$ modulation on an input analog signal to generate a pulse with a time density corresponding to the level of the input analog signal.

(2) While the invention is applied to a differential class D amplifier in the foregoing embodiments, the invention is also applicable to a non-differential class D amplifier.

(3) While in the first embodiment the source voltage of the current output comparator 201 is +VB (refer to FIG. 2) and the reference level +VB/2 is given to the positive phase input terminal of the operational amplifier 203 (refer to FIG. 1). For the class D amplifier according to the first embodiment, at least the center potential of the triangular wave signal TR must be equal to a potential given to the positive phase input terminal of the operational amplifier 203. The source voltage of the current output comparator 201 and the potential given to the positive phase input terminal may respectively have arbitrary values.

(4) While single-channel positive phase and negative phase bit streams are given to the input terminals 101p and 101n in the fifth embodiment, a multi-channel positive phase bit stream may be given to the input terminal 101p and a multi-channel negative phase bit stream may be given to the input terminal 101n. It is thus possible to provide a class D amplifier equipped with a mixing feature. In this case, a configuration is possible where variable resistors corresponding to the multiple channels are arranged before the input terminals 101p and 101n and the bit stream on each channel is given to the input terminal 101p or 101n via the variable resistor corresponding to the particular channel, and weighting on each channel is made in mixing through adjustment of the resistance value of each variable resistor.

(5) While single-bit positive phase and negative phase bit streams are given to the input terminals 101p and 101n in the fifth embodiment, a multi-bit positive phase bit stream may be given to the input terminal 101p and a multi-bit negative phase bit stream may be given to the input terminal 101n. In this case, a configuration is possible where weighted resistors corresponding to the multiple bits are arranged before the input terminals 101p and 101n and the bit stream for each bit is given to the input terminal 101p or 101n via the corresponding weighted resistor.

(6) Control of the degree of thinning using the switch 130 at the input part of a class D amplifier may be made in any form. While in the above embodiments negative feedback control is made where the amplitudes of the input analog signals VIp and VIn become larger and the level of the output signal of the error integrator increases, the thinning ratio is increased, control of the thinning ratio may be made in a form other than negative feedback control. For example, a form is possible where thinning ratios are previously determined to avoid clip on the input signals VIp and VIn at various peak levels, and the peak level of each of the input signals VIp and VIn is detected in operation of a class D amplifier and an appropriate thinning ratio is selected to avoid clip at that particular level in order to thin the input signals VIp and VIn. In an operation region where the input analog signals VIp and VIn are thinned, the upper limit value of the pulse-width modulation factor of each of the output digital signals VOp and VOn need to be maintained at a certain value in case the input analog signals VIp and VIn have increased. For example, the upper limit value of the pulse-width modulation factor may be slightly decreased according to the increase in the amplitude of each of the input analog signals VIp and VIn.

(7) While the PWM processing 403 is executed by the DSP 400 in the sixth embodiment, PDM (Pulse Density Modulation) processing to generate a pulse having a time density corresponding to the level of a modulating signal may be executed instead.

(8) While the variable gain amplification processing 401, the DRC processing 402 and the PWM processing 403 are executed by the DSP 400 in the sixth embodiment, a digital circuit or an analog circuit for respectively executing the variable gain amplification processing 401, the DRC processing 402 and the PWM processing 403 may be arranged before the switching amplification stage 410 instead of arranging the DSP 400.

What is claimed is:

1. A class D amplifier comprising:
an amplifier that generates a digital signal for driving a load based on an input signal;
an attenuator that attenuates the input signal according to an attenuation command signal; and
a clip prevention controller that outputs the attenuation command signal to intermittently attenuate the input signal when the digital signal is brought into a clip state or a near-clip state, wherein
the amplifier outputs the digital signal having a pulse width corresponding to the input signal according to a periodic synchronization signal, and
the clip prevention controller outputs the attenuation command signal according to the periodic synchronization signal.

2. The class D amplifier according to claims 1, further comprising a triangular wave generator for outputting a periodic triangular wave signal as the periodic synchronization signal,
wherein the amplifier includes an error integrator for integrating and outputting errors between the input signal and the digital signal, and a pulse-width modulator for outputting a digital signal pulse-width-modulated according to a level of an output signal from the error integrator based on a comparison between the output signal from the error integrator and the triangular wave signal, and
wherein the clip prevention controller assumes that the digital signal is in the clip state or near-clip state when the output signal from the error integrator exceeds a reference level and outputs the attenuation command signal.

3. The class D amplifier according to claim 2, wherein the clip prevention controller includes a comparison voltage generator for generating a comparison voltage at a level where the comparison voltage crosses the triangular wave signal when the output signal from the error integrator exceeds the reference level, and a comparator for comparing the comparison voltage with the triangular wave signal to output the attenuation command signal.

4. The class D amplifier according to claim 2, wherein the clip prevention controller detects that the digital signal is in the clip state or near-clip state based on the level of the digital signal at a timing of a peak of the triangular wave signal or at an immediately previous timing of the peak.

5. The class D amplifier according to claim 2, wherein the clip prevention controller holds a signal showing the result of comparison between the output signal from the error integrator in the pulse-width modulator and the triangular wave signal at a timing of a peak of the triangular wave signal or at an immediately after timing of the peak and detects that the digital signal is in the clip state or near-clip state based on the held signal.

6. The class D amplifier according to claim 1, wherein the input signal is an analog signal.

7. The class D amplifier according to claim 1, wherein the input signal is a digital signal.

8. A class D amplifier comprising:
an amplifier that generates a digital signal for driving a load based on an input signal; and
a gain controller that decreases a gain of the amplifier according to an increase in a level of the input signal so that a peak level of a waveform of the digital signal maintains a predetermined level when the digital signal is brought into a clip state or a near-clip state, wherein
the gain controller includes an attenuator that attenuates the input signal according to an attenuation command signal, and a clip prevention controller that detects that the digital signal is brought into the clip state or near-clip state and outputs the attenuation command signal, and
the amplifier outputs the digital signal having a pulse width corresponding to the input signal according to a periodic synchronization signal, and the clip prevention controller outputs the attenuation command signal according to the periodic synchronization signal.

9. The class D amplifier according to claim 8, wherein
the attenuator is provided at an input part of the amplifier, and
the clip prevention controller detects that the digital signal is brought into the clip state or near-clip state by monitoring a signal of a predetermined node in the amplifier.

10. The class D amplifier according to claim 9, further including a triangular wave generator that outputs a periodic triangular wave signal as the periodic synchronization signal, wherein
the amplifier includes an error integrator for integrating and outputting errors between the input analog signal and the digital signal and a pulse-width modulator for outputting a digital signal pulse-width-modulated according to a level of an output signal from the error integrator based on a comparison between the output signal from the error integrator and the triangular wave signal, and
clip prevention controller assumes that the digital signal is in the clip state or near-clip state when the output signal from the error integrator exceeds a reference level and outputs the attenuation command signal.

11. The class D amplifier according to claim 10, wherein the clip prevention controller includes a comparison voltage generator for generating a comparison voltage at a level where the comparison voltage crosses said triangular wave signal when the output signal from the error integrator exceeds a reference level, and a comparator for comparing the comparison voltage with the triangular wave signal to output the attenuation command signal.

12. The class D amplifier according to claim 10, wherein the clip prevention controller detects that the digital signal is in the clip state or near-clip state based on the level of the digital signal at a timing of a peak of the triangular wave signal or at an immediately previous timing of the peak.

13. The class D amplifier according to claim 10, wherein the clip prevention controller holds a signal showing the result of comparison between the output signal from the error integrator in the pulse-width modulator and the triangular wave signal at a timing of a peak of the triangular wave signal or at an immediately after timing of the peak and detects that the digital signal is in the clip state or near-clip state based on the held signal.

14. A class D amplifier comprising:
an amplifier that generates a digital signal for driving a load based on an input signal; and
a gain controller that decreases a gain of the amplifier according to an increase in a level of the input signal so that a peak level of a waveform of the digital signal maintains a predetermined level when the digital signal is brought into a clip state or a near-clip state, wherein
the gain controller includes an attenuator that attenuates the input signal according to an attenuation command signal, and a clip prevention controller that detects that the digital signal is brought into the clip state or near-clip state and outputs the attenuation command signal,
the amplifier outputs the digital signal having a pulse width corresponding to the input signal according to a periodic synchronization signal, and the clip prevention controller outputs the attenuation command signal according to the periodic synchronization signal,
the amplifier includes a pulse generator for outputting as the digital signal a pulse having a pulse width or pulse density modulated by a modulating signal,
the gain controller forms a part of the amplifier and includes a dynamic range compressor for performing dynamic range compression on a compression target signal given from a preceding stage to output as the modulating signal the resulting signal to the pulse generator, and
the dynamic range compressor amplifies the compression target signal with a predetermined gain in a linear region where the peak level of the compression target signal is lower than a predetermined threshold, and decreases the gain according to an increase in the peak level of the compression target signal so that the peak level of the modulating signal output to the pulse generator maintains the predetermined level in a saturation region where the peak level of the compression target signal exceeds the predetermined threshold.

15. The class D amplifier according to claim 14, wherein
the gain controller includes variable gain amplifier arranged in a preceding stage of the dynamic range compressor, and
the variable gain amplifier amplifies the input signal with a gain corresponding to a sound volume adjustment signal provided from outside and outputs the resulting signal as the compression target signal to the dynamic range compressor.

16. The class D amplifier according to claim 8, wherein the input signal is an analog signal.

17. The class D amplifier according to claim 8, wherein the input signal is a digital signal.

* * * * *